Figure 1:
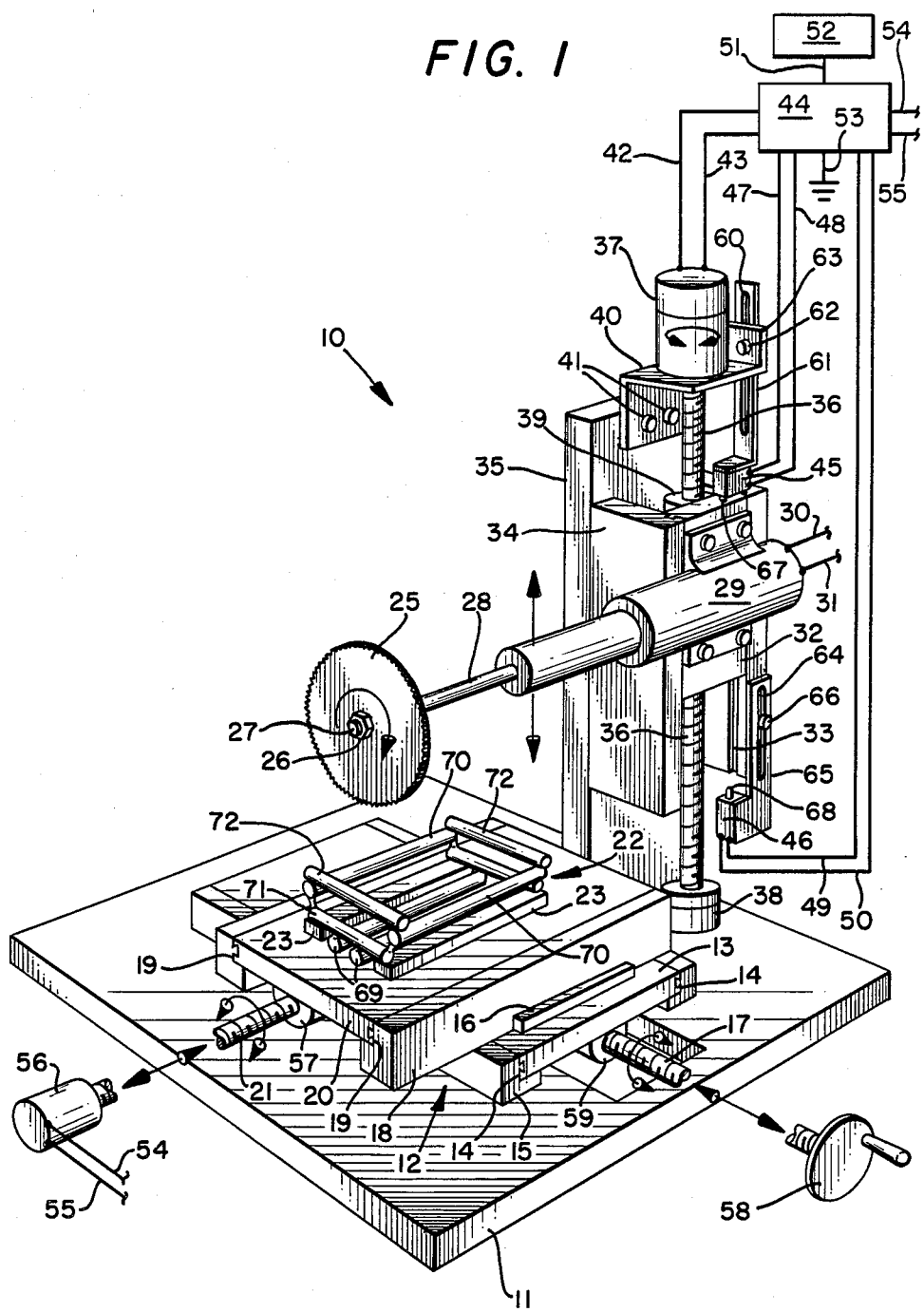

United States Patent [19]

Johnson, Jr.

[11] Patent Number: 4,738,573
[45] Date of Patent: Apr. 19, 1988

[54] SILICON WAFER PROCESSING BOAT CARRIER SLOT PLUNGE CUTTER

[76] Inventor: Christian F. Johnson, Jr., 6557 Patricia, Plano, Tex. 75023

[21] Appl. No.: 1,427

[22] Filed: Jan. 8, 1987

[51] Int. Cl.[4] .......................... B23C 3/28; B23D 47/02
[52] U.S. Cl. ................................... 409/184; 83/471.3; 83/488; 83/875; 409/193; 409/201
[58] Field of Search ................. 83/875, 886, 887, 487, 83/488, 471.3; 409/183, 184, 197, 259, 304, 201, 193; 144/133 R, 136 R

[56] References Cited

U.S. PATENT DOCUMENTS

| | | | |
|---|---|---|---|
| 2,464,297 | 3/1949 | Ertl | 409/197 |
| 3,388,414 | 6/1968 | Hilty et al. | 83/875 X |
| 4,036,093 | 7/1977 | Thorsell | 83/488 X |
| 4,574,670 | 3/1986 | Johnson | 83/471.3 X |

Primary Examiner—Gil Weidenfeld
Assistant Examiner—Steven C. Bishop
Attorney, Agent, or Firm—Warren H. Kintzinger

[57] ABSTRACT

A silicon wafer diffusion processing quartz boat carrier slot plunge cutter machine is provided that has a vertical rapid traverse power feed variable speed spindle with automatic stop switches controlling down feed and return with spindle speeds generally in the range of 3,000 RPM to 4,500 RPM for effective quartz slot cutting. Work piece table longitudinal and cross travel are manually driven with longitudinal travel for work piece to cutting tool alignment and cross travel being for indexing of specific slotting configurations. A fixed table support is adapted to mounting of various jig types for slotting as desired.

12 Claims, 5 Drawing Sheets

SILICON WAFER PROCESSING BOAT CARRIER SLOT PLUNGE CUTTER

This invention relates in general to the production of silicon wafer processing boat carriers, and more particularly, to a silicon wafer diffusion processing quartz boat carrier slot plunge cutter.

Quartz material is a relatively expensive material but is good from a temperature variance and heating standpoint with excellent thermo stability through great temperature ranges such as experienced with wafer carrying boats. It is important the quartz boats carrying oven heated disc substrates carry the substrate discs in uniformly spaced relation with minimum boat to disc substrate wafer contact for minimum boat carrier interference with the oven thermal disc treating process. Substrate disc wafer carrying slots in quartz boats should be aligned with one another for uniform wafer disc oven heat process treating and should support substrate wafers so they experience the same amount of expansion under heat without wafer pinching and/or warping. Disc slot depth indexing should be identical slot to slot regardless of variance in positioning of rods during construction of a quartz boat and regardless of any quartz rod diameter variance.

It is therefore a principal object of this invention to provide a quartz boat disc wafer slot cutter producing boat rod or tubing slot cuts in mutual alignment with one another.

Another object is to provide a quartz boat plunge cutter having a variable speed spindle with automatic stop switches limiting down feed and return with a high speed circular slotting blade.

A further object is to provide quartz boats so slotted that wafer discs experience the same amount of expansion under heat without wafer pinching or warping.

Still another object is to provide a circular slotting blade plunge cutter capable of cutting straight vertical slots or angled slots.

Features of the invention useful in accomplishing the above objects include in a silicon wafer oven processing boat carrier slot plunge cutter, a quartz boat wafer disc carrier slot plunge cutter machine having a vertical rapid transverse power feed variable speed spindle with automatic travel limit stop switches controlling down feed stop and return limits. The spindle drives high speed circular slotting blades up into the range of 3,000 RPM to 4,500 RPM for effective quartz slot cutting either vertical slots or angled slots for carrying disc wafers aligned with one another for uniform wafer disc oven heat process treating. Work piece table longitudinal and cross travel are manually settable with longitudinal travel for work piece to cutting tool alignment by slot cutting steps and cross travel indexing for specific slotting configurations. A table support adapts to mounting of various jig types for slotting as desired.

Specific embodiments representing what are presently regarded as the best modes of carrying out the invention are illustrated in the accompanying drawings.

Figure 2:
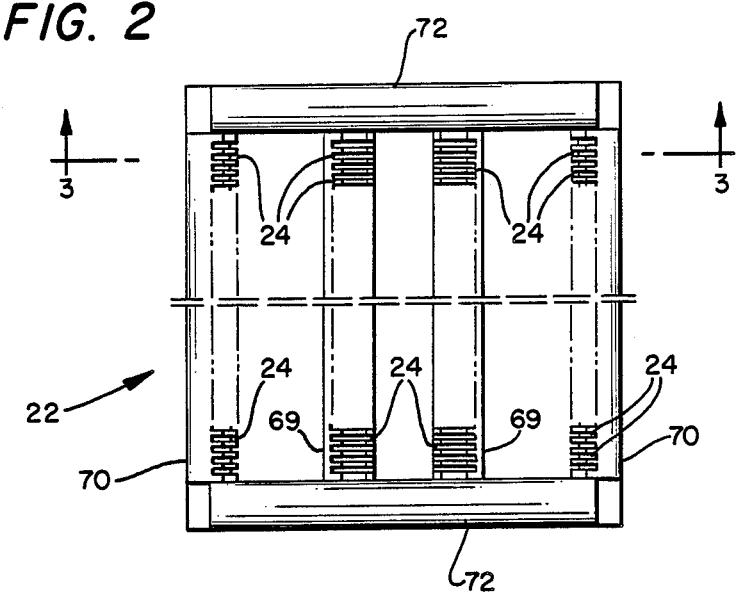
Figure 3:
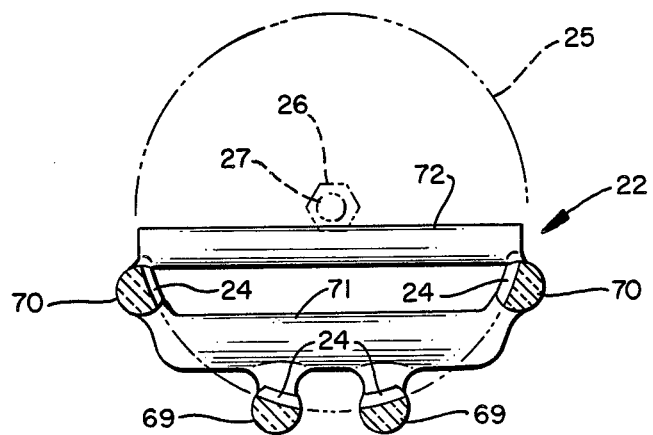
Figure 4:
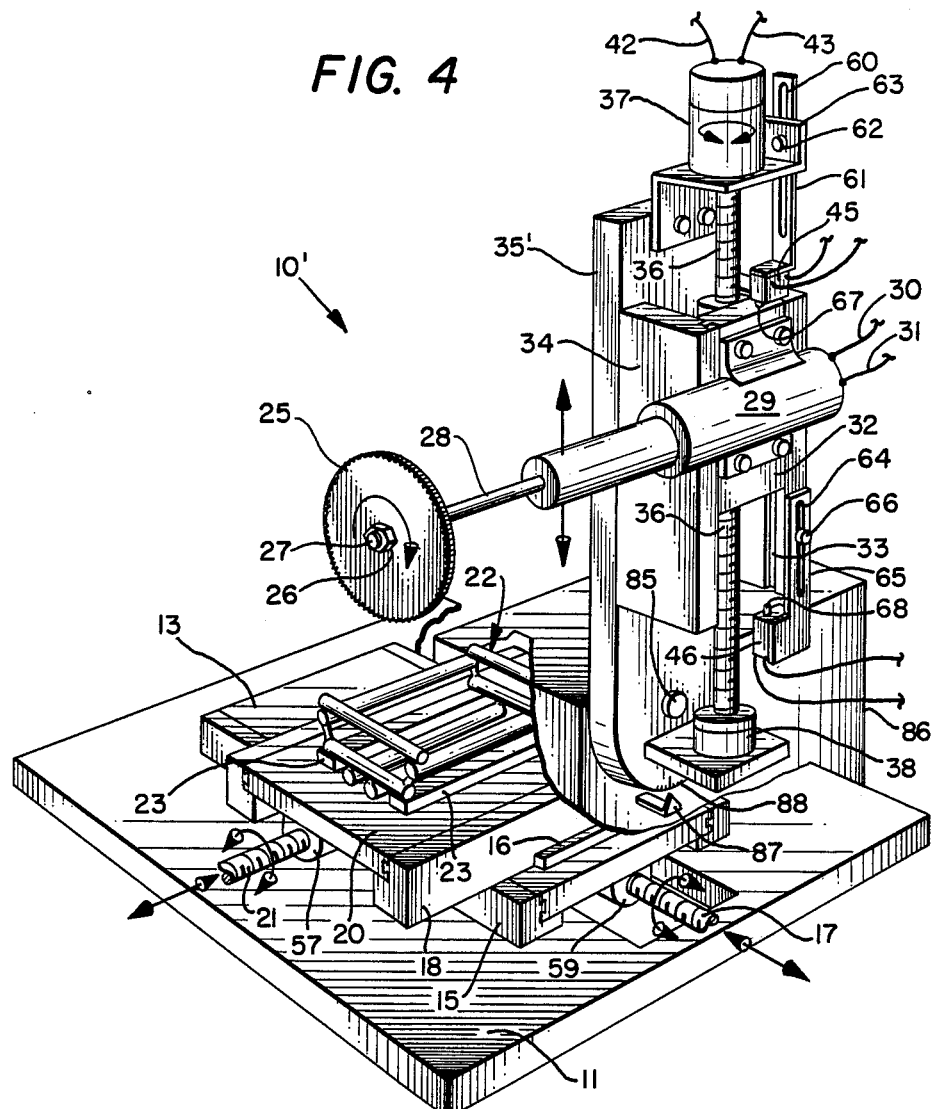
Figure 8:
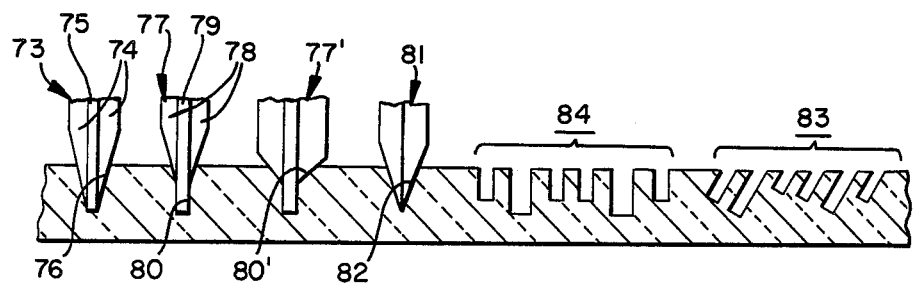
Figure 5:
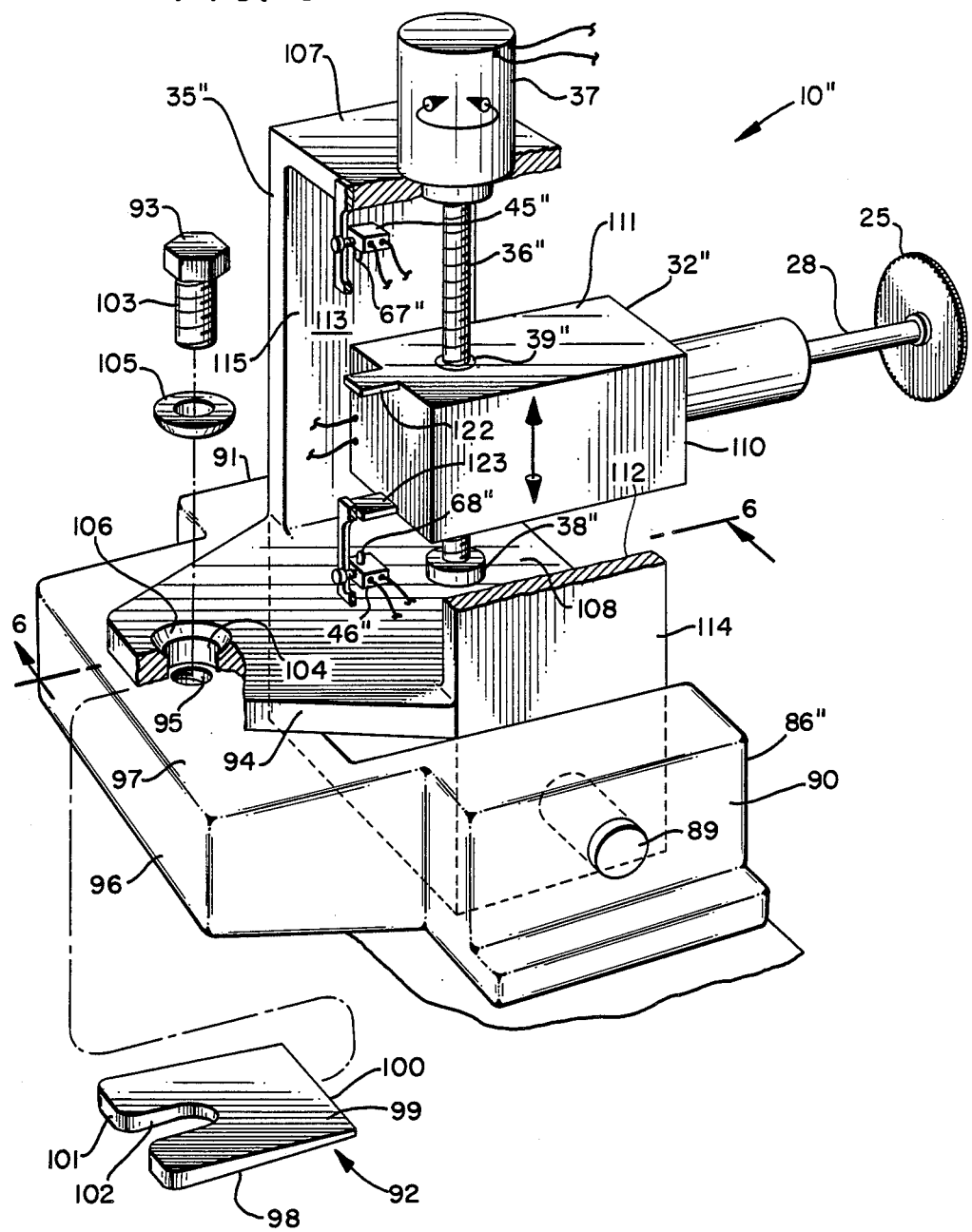
Figure 6:
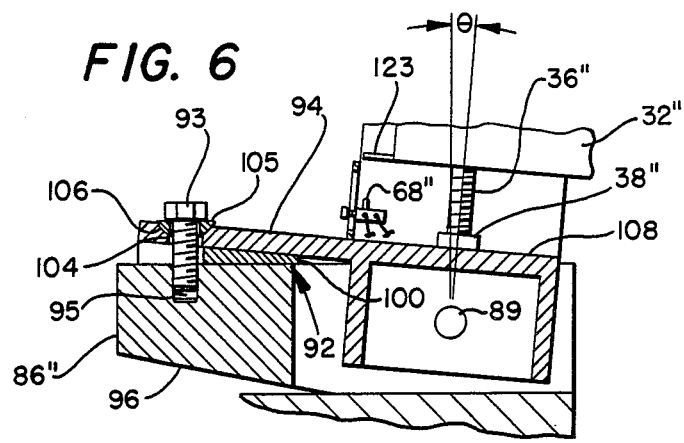
Figure 7:
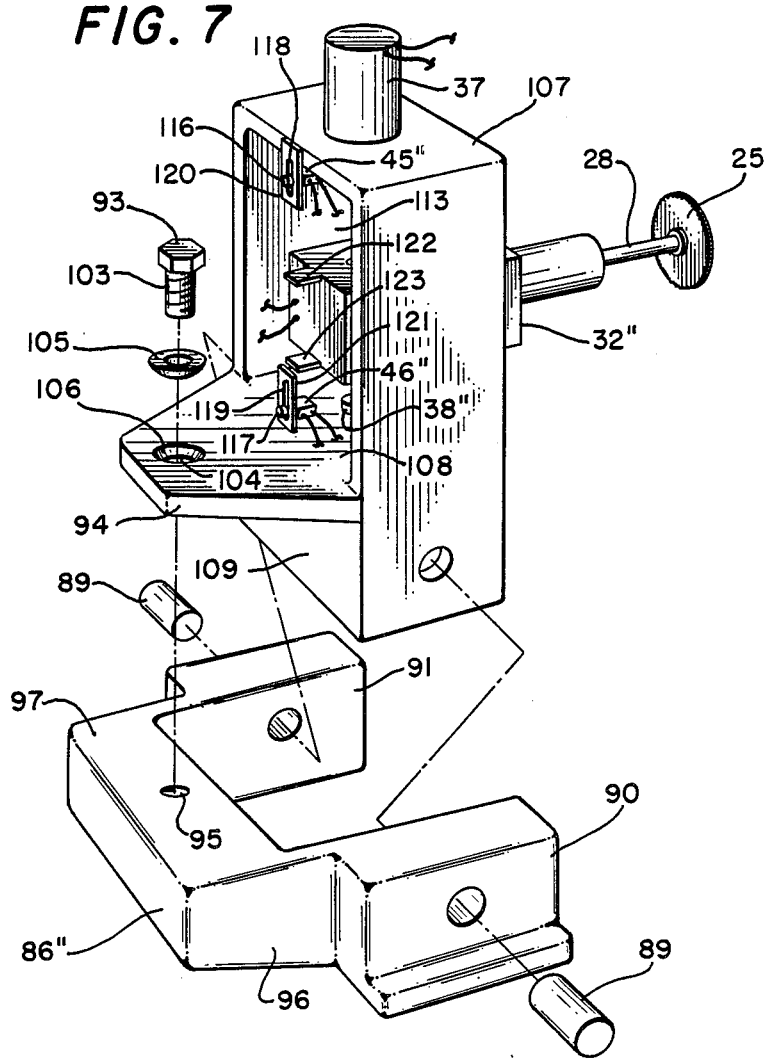

In the drawings:

FIG. 1 represents a front perspective view of a circular slotting blade plunge cutter with a vertical traversing spindle and spindle motor carriage with the circular slotting blade for slotting a quartz boat jig mounted on a machine table with longitudinal and transverse cross position setting capabilities;

FIG. 2, a top plan view of silicon wafer processing quartz boat carrier with rods thereof plunge cut with a plurality of slots by the plunge cutter of FIG. 1;

FIG. 3, a cut away and sectioned view taken along line 3—3 of FIG. 2 showing additional detail of the quartz boat and the slot cut profile;

FIG. 4, a front perspective view like FIG. 1 of a plunge cutter with, however the spindle motor, spindle and circular blade carriage mounting vertical column pivotal to different angles for plunge cutting angled slots in silicon wafer processing quartz boats;

FIG. 5, a rear perspective view of another plunge cutter partially broken away for additional detail;

FIG. 6, a partial section taken along line 6—6 of FIG. 5 showing angled shim and bolt detail;

FIG. 7, an exploded view of the plunge cutter column of FIG. 5 and its pivotal base mounting with the vertical column lifted clear of its pivotal base mounting and pivot mounting pins drawn out to the sides; and FIG. 8, a showing of various slot configurations obtainable with various plunge cutter embodiments along with various circular slotting blades therefor.

Referring to the drawings:

The plunge cutter 10 of FIG. 1 has a table support 11 with a work piece table support structure 12 having a transverse moveable table carrier 13 slideable along slide ways 14 in base 15, mounted on table support 11 with jig 16, as driven by drive screw 17. The base 18 mounted on transverse moveable table carrier 13 is a base with ways 19 of longitudinal adjustment of slide moveable table 20 carried thereby as driven by drive screw 21. Drive screws 17 and 21 may be manually turned or motor-computed controlled (some detail not shown) for positioning the work piece quartz boat 22 mounted with jig member 23 for cutting a plurality of vertical slots 24 therein as shown in FIGS. 2 and 3 by plunge cutter circular slotting blade 25. The circular slotting blade 25 is mounted by nut 26 on the threaded end 27 of cutting blade spindle 28 that is driven up to relatively high speeds (typically up into the range of 3,000 RPM to 4,500 RPM) by the electric motor 29, with power lines 30 and 31, mounted on motor and cutter spindle carriage 32 is mounted in vertical ways 33 of carriage mount 34 of vertical column 35. The motor and cutter spindle carriage 32 is driven up and down by vertical drive screw 36 as driven by reversible drive motor 37. The drive screw 36 extends from shaft support bearing 38 on table support 11 through the internally threaded drive bushing 39 on carriage 32 to reversible drive motor 37 mounted on a bracket 40 fastened by bolts 41 to the top of vertical column 35. Reversible drive motor 37 has power input control lines 42 and 43 from machine drive circuit 44 that may include programmed computer control with travel limit signal inputs from upper and lower limit switches 45 and 46 that are connected through lines 47 and 48, and 49 and 50, respectively, to the control circuit 44. Control circuit 44 in addition to power input through cable 51 from power source 52 and a connection 53 to ground has power control lines 54 and 55 to drive screw reversible drive motor 56 that may be step driven so that drive screw 21 acting through internally threaded drive bushing 57 drives slide moveable table 20 from one boat 22 vertical slot 24 machining position to the next. The drive screw 17 is driveable by hand crank 58 in driving transverse moveable table carrier 13 via internally threaded drive bushing 59. The upper limit switch 45 has a slotted 60 adjustment extension 61 that may be adjustably position fixed by tightening of bolt 62 on flange 63 of bracket 40. The lower limit switch 46 has a slotted 64 adjustment extension 65 that may be adjustably position fixed by tightening of bolt 66 into carriage mount 34. With upper and lower limit switches 45 and 46 so adjustably mounted activating contact of the carriage 32 top or bottom with the activating switch button 67 or 68, respectively, of upper limit switch 45 and lower limit switch 46 stops or reverses via control circuit 44 the reverseable drive motor 37 in the plunge cutter boat slot cutting cycle.

A boat 22 as a work piece to be slot machined by the plunge cutter 10 is typically a quartz boat assembled of bottom rods 69 and opposite side rods 70 with opposite end transverse interconnect rods 71 and 72 all weld interconnected. The rods 69, 70, 71 and 72, could be solid rods, or some tubes, or all tubes for weight and thermal heating considerations. Various slot configurations are shown in FIG. 9 obtainable with various plunge cutter embodiments and circular slotting blade 25 configurations. A straight blade 25 could be used for the straight slots and for the angled slots shown. A compound multiple section blade 73 with slope sections 74 and an opposite sides of a center blade section 75 could be used for slope sided slot 76. A similar compound multiple section blade 77 with reduced diameter slope sections 78 on opposite sides of a center blade section 79 could be used for the "Y" slot 80. The compound multiple section blade 77' for the "Y" slot 80' is much the same as blade 77 with only the angle different. A pointed profile blade 81 is used to cut the "V" slot 82.

Referring now to the plunge cutter 10' of FIG. 4 a plunge cutter is shown wherein the table support 11' and the vertical column 35' have much in common with their counterparts in the FIG. 1 embodiment with a primary difference being that the vertical column 35' is pivotally mounted relative to the table support 11'. This structure enables the column 35' to be pivoted from the true vertical through a series of angled settings for desired angled slots. Such angled slots as typified by the illustrative slot family 83 of different depth angled slots in comparison to the varied slot family 84 of vertical slots shown in profile in FIG. 8. With the plunge cutter 10' embodiment of FIG. 4 the vertical column 35' is pivoted about its pivot pin 85 mounting on machine base 86 and locked in place (locking detail not shown) to different angled settings as indicated by gauge pointer 87 and scribed markings 88 on the bottom of vertical column 35'. Thus, this embodiment may be set for plunger cutting vertical slots or angled slots in either sloped direction with other parts and components the same as with the embodiment of FIG. 1 numbered the same and not described again here as a matter of convenience.

With the plunge cutter 10" embodiment of FIGS. 5-7 table detail is not shown other than pivotal mounting of a vertical column 35" with opposite side pivot pins 89 extended through opposite side base shoulders 90 and 91 of machine base 86". This structure enables the column 35" to be pivoted from the true vertical through a series of angled settings for desired angled slots from vertical with no shim to the angled settings with a horse shoe shaped slope surfaced shim 92 of a set of shims of various angles 1°, 2°, 3°, 4°, 5° etc. being locked in place by bolt 93 being tightened down on column shoulder 94 and into threaded opening 95 in boss 96 of machine base 86". With the column 35" set to vertical the column shoulder 94 is tightened down directly to the top face 97 of boss 96 and if set to an angle a shim 92 of the desired angle is placed between the column shoulder 94 and the top face 97 of boss 96. Each shim 92 is formed with a flat bottom 98 and a sloped top 99 that extend from a narrow front edge 100 to a thickened rear edge 101 with a notch cut out 102 to accomodate the threaded shank 103 of bolt 93 that is passed through opening 104 in column shoulder 94 and threaded into boss threaded opening 95. The opening 104 in column shoulder 94 is oversize relative to the threaded shank 103 of bolt 93 and the bolt is supplied with a spheroid section surfaced washer 105 that seats in spheriod section depression 106 in column shoulder 94 to adapt to alignment variations through the range of different shims 92 angle settings.

The drive screw 36" in this embodiment extends from reversible drive motor 37 mounted on the top 107 of column 35" down through an internally threaded bushing 39" extended through cutter spindle carriage 32" on down to screw shaft support bearing 38" on the top 108 of the pivotal base 109 of vertical column 35". The cutter spindle carriage 32" is stabilized through its range of up and down movement by sliding engagement of opposite sides 110 and 111 thereof along inside surfaces 112 and 113 of column opposite side walls 114 and 115. Upper and lower travel limit switches 45" and 46" are adjustably position locked by screws 116 and 117 along slots 118 and 119 in upper brackets and lower brackets 120 and 121 in order that upper and lower projections 122 and 123 of the carriage 32" come into activating contact top and bottom with the activating switch button 67" or 68", respectively. This stops or reverses the reverseable drive motor 37 in the desired plunge cutter boat slot cutting cycle. Thus, this embodiment may be set for plunge cutting vertical slots or angled slots with other parts and components the same as with the embodiment of FIG. 1 numbered the same as a matter of convenience.

Whereas this invention has been described particularly with respect to several embodiments thereof, it should be realized that various changes may be made without departure from the essential contributions to the art made by the teachings hereof.

I claim:

1. A slot plunge cutter comprising: a work piece table adapted for supporting a work piece for slot plunge cut processing; a machine base mounting said work piece table; a vertical column mounted on said machine base; a spindle mounting a circular slotting blade; a motor driving said spindle and said slotting blade; a moveable carriage mounting said motor and said spindle mounted for movement up and down said vertical column between upper and lower limit positions; guide means in said vertical column for up and down movement of said moveable carriage; and vertical drive means for driving said moveable carriage up and down said vertical column; wherein said vertical drive means includes, a vertical drive screw; an internally threaded drive bushing on said carriage through which said vertical drive screw extends; a reversible drive motor drive connected to said vertical drive screw; control means for controlled activation of said reversible drive motor; said spindle with said motor driving said spindle is mounted on said carriage with said spindle extending outward and away to a circular blade mounted coplanar to the direction of up and down driven movement of said carriage and said circular blade; said moveable carriage upper and lower limit positions are established by upper and lower limit switches mounted on said vertical column for engagement by said moveable carriage; adjustable position mounting means for each of said upper and lower limit switches; circuit interconnect means from said upper and lower limit switches to control circuit means of said control means power circuit connected to said reversible drive motor; said vertical column is pivotally mounted on said machine base; and pivot position setting means for setting said vertical column at different desired angles in addition to true vertical relative to said work table for plunge cutting angled slots in said work piece, said vertical column is pivotally mounted by pivot pin means extended through the bottom of said vertical column and into said base; and wherein said vertical column has angled position setting means; a sloped thickness shim selected from a family of various angle setting shims is inserted between said angled position setting means of said vertical column and a surface of said machine base; and a position locking threaded means extended through said angled position means and into a threaded opening in said machine base.

2. The slot plunge cutter of claim 1, wherein said circular blade is rectangular in cross section so as to plunge cut rectangular slots in a work piece being plunge cut.

3. The slot plunge cutter of claim 1, wherein said circular blade is a multi section blade mounted together in assembly on the circular blade mounting end of said spindle remote from said carriage.

4. The slot plunge cutter of claim 3, wherein said circular blade is a compound multi section blade with slope sections in cross section.

5. The slot plunge cutter of claim 3, wherein said circular blade is a compound multi section blade with reduced diameter slope sections on opposite sides of a center blade section with a "Y" shape in cross section for plunge cutting "Y" shaped slots in a work piece.

6. The slot plunge cutter of claim 1, wherein said circular blade is a pointed profileblade for plunge cutting "V" shaped slots in a work piece.

7. The slot plunge cutter of claim 1, wherein said guide means in said vertical column for up and down movement of said moveable carriage is a double sided guide keyway in said vertical column.

8. The slot plunge cutter of claim 7, wherein said vertical column is fixed in assembly with said work piece table.

9. The slot plunge cutter of claim 8, wherein said reversible drive motor is mounted at the top of said vertical column; and a shaft support bearing is provided for said vertical drive screw at the bottom of said vertical drive screw.

10. The slot plunge cutter of claim 1, wherein said vertical column is provided with gauge pointed and scribed marking pivot position indicating means.

11. The slot plunge cutter of claim 1, wherein said shim has a notch cut out through which said position locking threaded means extends when the shim is in place with the column in the angle position locked state.

12. The slot plunge cutter of claim 11, wherein said position locking threaded means is a bolt; and said angled position means is a shoulder extended from said vertical column.

* * * * *